United States Patent [19]

Scheuerlein

[11] Patent Number: 4,574,365
[45] Date of Patent: Mar. 4, 1986

[54] SHARED ACCESS LINES MEMORY CELLS

[75] Inventor: Roy E. Scheuerlein, Burlington, Vt.

[73] Assignee: International Business Machines Corporation, Armonk, N.Y.

[21] Appl. No.: 485,808

[22] Filed: Apr. 18, 1983

[51] Int. Cl.[4] .................... G11C 13/00; G11C 11/24
[52] U.S. Cl. .................................... 365/149; 365/189
[58] Field of Search ............... 365/149, 182, 189, 230

[56] References Cited

U.S. PATENT DOCUMENTS

| | | | |
|---|---|---|---|
| 419,095 | 1/1890 | Thoma | 111/16 |
| 3,387,286 | 6/1968 | Dennard | 340/173 |
| 3,979,734 | 9/1976 | Pricer et al. | 340/173 CA |
| 4,040,016 | 8/1977 | Lee et al. | 340/173 CA |
| 4,040,017 | 8/1977 | Lee | 340/173 R |
| 4,080,590 | 3/1978 | Pricer | 365/149 |
| 4,086,662 | 4/1978 | Itoh | 365/189 |

OTHER PUBLICATIONS

L. Arzubi et al., "One-Device Memory Cell Arrangement with Improved Sense Signals", IBM Technical Disclosure Bulletin, 11/80, pp. 2331-2332.

Primary Examiner—Terrell W. Fears
Attorney, Agent, or Firm—Stephen J. Limanek

[57] ABSTRACT

A memory array is provided which includes a common sense line to which is connected a first storage capacitor through first switching means and a second storage capacitor through second switching means, with a common word line connected to the control electrodes of the first and second switching means, a first bit line connected to a plate of the first storage capacitor and a second bit line connected to a plate of the second storage capacitor. Data is stored into or read from the first storage capacitor by selecting the common word line and the first bit line and data is stored into and read from the second storage capacitor by selecting the common word line and the second bit line, with the data from both storage capacitors being detected on the common sense line.

26 Claims, 7 Drawing Figures

SHARED ACCESS LINES MEMORY CELLS

TECHNICAL FIELD

This invention relates to integrated semiconductor memory circuits and more particularly to memory circuits which employ a capacitor for storing binary digits of information.

BACKGROUND ART

Integrated semiconductor memory circuits, particularly those employing cells which include essentially a storage capacitor and a switch, have achieved high memory cell densities. One of the simplest circuits for providing small memory cells is described in commonly assigned U.S. Pat. No. 3,387,286, filed July 14, 1967, by R. H. Dennard. Each of these cells employs a storage capacitor and a field effect transistor acting as a switch to selectively connect the capacitor to a bit/sense line.

Commonly assigned U.S. Pat. No. 3,979,734, filed by W. D. Pricer and J. E. Selleck on June 16, 1975, describes a memory array made of small cells which employ storage capacitors and bipolar transistors. In this latter array, which is word organized, each storage capacitor of these cells has simply one capacitor terminal connected to a separate bit/sense line while selected cells forming a word are simultaneously accessed by utilizing a word pulse for coupling to the other terminal of the storage capacitors of that word.

In commonly assigned U.S. Pat. No. 4,080,590, filed by W. D. Pricer on Mar. 31, 1976, there is described a semiconductor memory produced in a unipolar technology which includes a cell having an inversion storage capacitor with one terminal connected to a bit/sense line, the other terminal being coupled to a source of charges by a pulse from a word line. To provide a word organized array of these cells, each word includes a source of charges disposed at the surface of a semiconductor substrate and a plurality of inversion capacitors disposed also at the surface of the semiconductor in spaced apart relationship from the charge source. Information is written into the capacitors by applying voltages of two different magnitudes, representing 1 and 0 bits of information, to one terminal of each of the capacitors while a word pulse produces inversion layers at the surface of the substrate between the capacitors to interconnect serially the charge source with each of the capacitors. The capacitors having the larger voltage store the greater amount of charge. This charge can then be detected by measuring the voltage across the storage capacitors when a word pulse again connects the charge source with each of the capacitors.

In yet another commonly assigned U.S. Pat. No. 4,040,017, filed by H. S. Lee on Mar. 31, 1976, there is disclosed a memory which is an improvement over the memory described in U.S. Pat. No. 4,080,590. In the improved memory, the source of charges is selectively pulsed to inject charge into the storage capacitors. The pulses of charge are timed so that they begin at least by the onset of the word pulse and terminate prior to the termination of the word pulse. Furthermore, prior to the termination of the word pulse, the voltage at the charge source is set to form a charge sink for draining excess charges. This charge flow technique may be referred to as a fill-spill operation.

In still another commonly assigned U.S. Pat. No. 4,040,016, filed by H. S. Lee and G. Vogl, Jr. on Mar. 31, 1976, there is disclosed a memory of the type described in above-identified H. S. Lee patent but wherein each cell of the memory has a pair of inversion capacitors with one plate of each capacitor connected to one of a pair of bit/sense lines, the other plate of each capacitor being coupled to the source of charges when the word line is pulsed.

U.S. Pat. No. 4,086,662, filed by K. Itok on Aug. 11, 1976, describes a memory of the type disclosed in the above-identified Dennard patent but wherein a common sense amplifier is provided for a plurality of sense lines and a cell is located at each intersection of a word line and a sense line, with a control line connected to plates of the storage capacitors of the cells and a word line being used to read or write information from or to a given cell.

In commonly assigned U.S patent application Ser. No. 419,095, filed by E. P. Thoma on Sept. 16, 1982, there is disclosed a memory cell having a storage capacitor wherein a data sense-restore scheme is used in which a data sense line senses the state of charge in a selected cell and a data responsive circuit is used to rewrite low voltage signals through a separately accessed write device or transistor.

The IBM Technical Disclosure Bulletin article "One-device Memory Cell Arrangement with Improved Sense Signals," Vol. 23, No. 6, Nov. 1980, pp. 2331-2332, by L. Arzubi and W. D. Loeklein, teaches a memory array having cells each of which includes a storage capacitor and a transistor wherein the voltage applied to the plate side of the storage capacitor is dependent upon the state of the data sensed.

DISCLOSURE OF THE INVENTION

It is an object of this invention to provide an improved memory array including cells, each of which has a very small area, utilizing a single storage capacitor and a single switch coupled to a sense line having lower capacitance per cell to provide a high signal transfer ratio and an increased sense line pitch. The size of each cell of the array is significantly smaller than known one device dynamic memory cells.

In accordance with the teachings of this invention, a memory array is provided which includes a common sense line to which is connected a first storage capacitor through first switching means and a second storage capacitor through second switching means, with a common word line connected to the control electrodes of the first and second switching means, a first bit line connected to a plate of the first storage capacitor and a second bit line connected to a plate of the second storage capacitor. Data is stored into or read from the first storage capacitor by selecting the common word line and the first bit line and data is stored into or read from the second storage capacitor by selecting the common word line and the second bit line.

The foregoing and other objects, features and advantages of the invention will be apparent from the following more particular description of the preferred embodiments of the invention, as illustrated in the accompanying drawings.

BEST MODE FOR CARRYING OUT THE INVENTION

Figure 1:
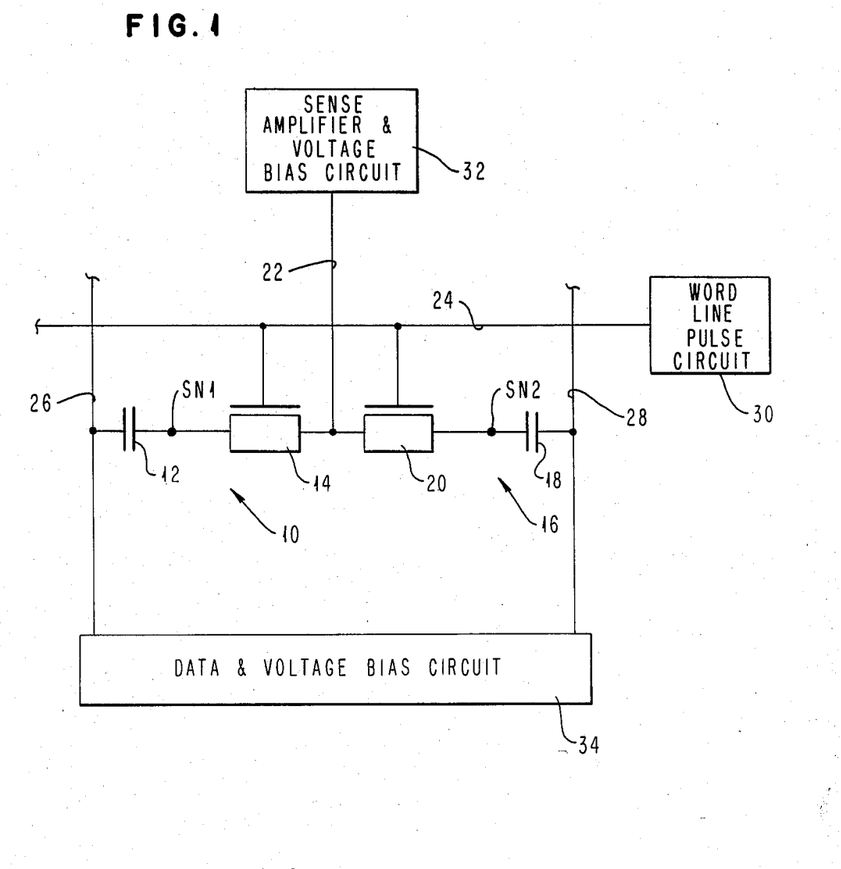
FIG. 1 illustrates an embodiment of a circuit of the present invention having two cells each connected to a common word line and to a common sense line.

Referring to the drawings in more detail, there is illustrated in FIG. 1 an embodiment of the circuit of the present invention which includes a first cell 10 having a first storage capacitor 12 and a first switching device, e.g., a field effect transistor 14, and a second cell 16 having a second storage capacitor 18 and a second switching device, e.g., a field effect transistor 20. A first storage node SN1 in the first cell 10 is located at the common point between capacitor 12 and transistor 14, and a second storage node SN2 in the second cell 16 is located at the common point between capacitor 18 and transistor 20. A common sense line 22 is connected to a current carrying electrode of the transistors 14 and 20 and a common word line 24 is connected to the control or gate electrode of each of the transistors 14 and 20. A first bit or plate line 26 is connected to a plate of the first storage capacitor 12, with the other plate or electrode of the capacitor 12 being connected to the sense line 22 through the first transistor 14. A second bit or plate line 28 is connected to a plate of the second storage capacitor 18, with the other plate or electrode of the capacitor 18 being connected to the sense line 22 through the second transistor 20. A word line pulse circuit 30, of any conventional type, is connected to the word line 24, a sense amplifier and voltage bias circuit 32, also of any conventional type, is connected to the sense line 22 and a data and voltage bias circuit 34 is connected to the first and second bit lines 26 and 28. The voltage selectively applied by circuits 30, 32 and 34 to the respective lines 22, 24, 26 and 28 is preferably VDD= +5 volts.

Figure 2:
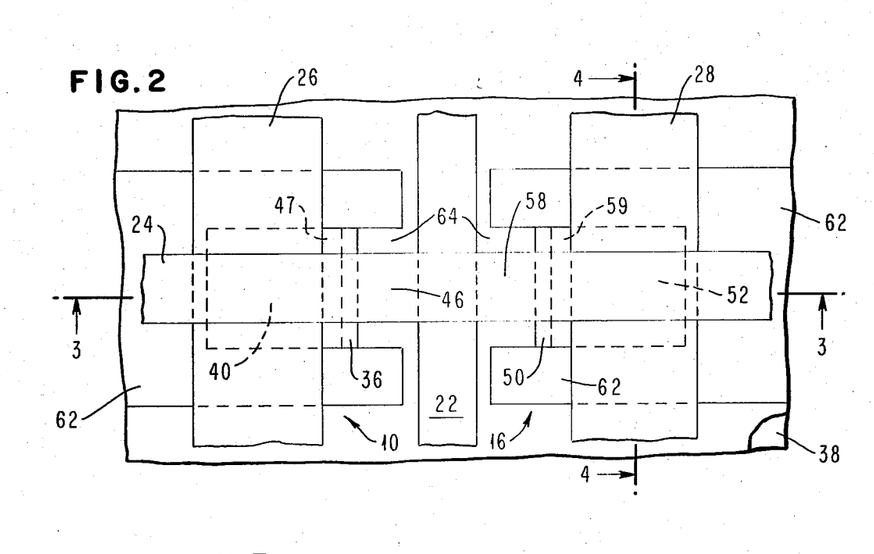
FIG. 2 is a plan view of the circuit illustrated in FIG. 1 formed in a semiconductor substrate.
Figure 3:
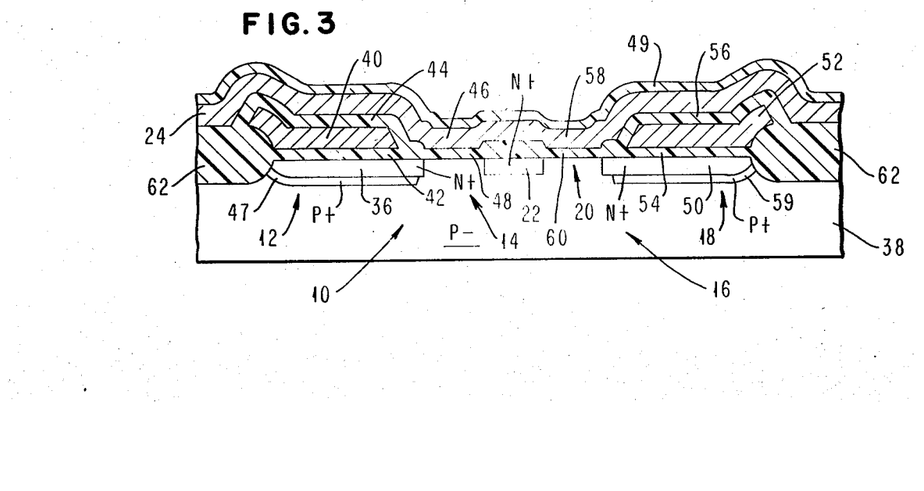
FIG. 3 is a sectional view of the circuit shown in FIG. 2 taken along line 3—3 thereof.
Figure 4:
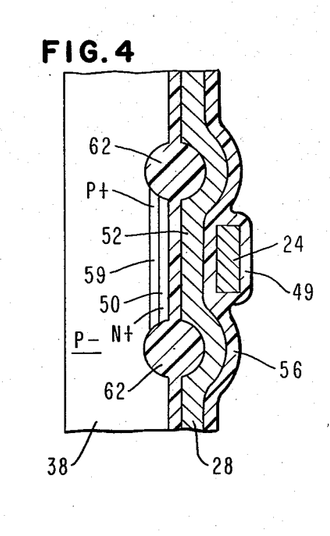
FIG. 4 is a sectional view of the circuit shown in FIG. 2 taken along line 4—4 thereof.

A layout or plan view of cells 10 and 16 is shown in FIG. 2, with sections of FIG. 2 taken through lines 3—3 and 4—4 illustrated in FIGS. 3 and 4, respectively. The first cell 10 includes the first storage capacitor 12 having an N+ diffusion region 36 formed in a semiconductor substrate 38 and a plate 40 having interposed therebetween a thin dielectric layer 42, preferably made of silicon dioxide. As shown more clearly in FIG. 2, the plate 40 is a segment or portion of the first bit or plate line 26, which is preferably formed from a first layer of doped polysilicon by any known process. The first bit or plate line 26 has a layer of insulation 44, preferably made of silicon dioxide, formed thereon. The first cell 10 also includes the first transistor 14 having a gate electrode 46 and a thin gate insulation layer 48 interposed between the gate electrode 46 and the surface of the semiconductor substrate 38. As shown more clearly in FIG. 3, the gate electrode 46 is a segment or portion of the word line 24, which is preferably formed from a second layer of doped polysilicon. A layer of insulation 49, preferably made of silicon dioxide, is formed over the word line 24. The current carrying electrodes of the first transistor 14 are formed by the N+ diffusion region 36 of the first capacitor 12 and the sense line 22 made as an elongated N+ diffusion region. The N+ diffusion regions 36 and 22 define the channel region of the transistor 14 under the gate electrode 46. A P+ diffusion region 47 formed below the N+ diffusion region 36 provides enhanced junction capacitance and reduced sensitivity to stray charge such as that produced by alpha or other high energy particles passing through the substrate 38.

The second cell 16 includes the second storage capacitor 18 having an N+ diffusion region 50 formed in the substrate 38 and a plate 52 having interposed therebetween a thin dielectric layer 54. As shown more clearly in FIGS. 2 and 4, the plate 52 is a segment or portion of the second bit or plate line 28, which can also be formed from the first layer of doped polysilicon. The second bit line 28 has a layer of insulation 56 formed thereon. The second cell 16 also includes the second transistor 20 having a gate electrode 58 and a thin gate insulation layer 60 interposed between the gate electrode 58 and the surface of the semiconductor substrate 38. As shown more clearly in FIG. 3, the gate electrode 58 is a segment or portion of the word line 24. The current carrying electrodes of the second transistor 20 are formed by the N+ diffusion region 50 of the second capacitor 18 and the sense line diffusion region 22. The N+ diffusion regions 50 and 22 define the channel region of the transistor 20 under the gate electrode 58. A P+ diffusion region 59 formed below the N+ diffusion region 50 provides enhanced junction capacitance and reduced sensitivity to stray charge in the substrate 38. A thick insulating layer or recessed oxide 62 is used to isolate cells 10 and 16 from any adjacent cells that may be formed in the substrate 38. Isolating region 64 preferably formed at the same time as insulation layer 49 is used to isolate N+ diffusion regions 36 and 50 from sense line diffusion region 22.

When fabricating cells 10 and 16, the recessed oxide 62 is preferably formed first and then N+ and P+ diffusion regions 22, 36 47, 50 and 59 are made in the surface of the substrate 38. Prior to forming bit lines 26 and 28 from the first polysilicon layer, the thin dielectric layers 42 and 54 are grown on the surface of the substrate 38, and the bit lines 26 and 28 are covered by insulation layers 44 and 56. Then the thin gate insulation layers 48 and 60 are grown by known techniques, followed by the deposition of the second polysilicon layer from which the word line 24 is formed. The insulating or passivating layers 49 and 64 are next grown or deposited to cover the word line 24 and the surface of the substrate 38 between diffusion regions 36 and 50 and sense line diffusion region 22.

Figure 5:
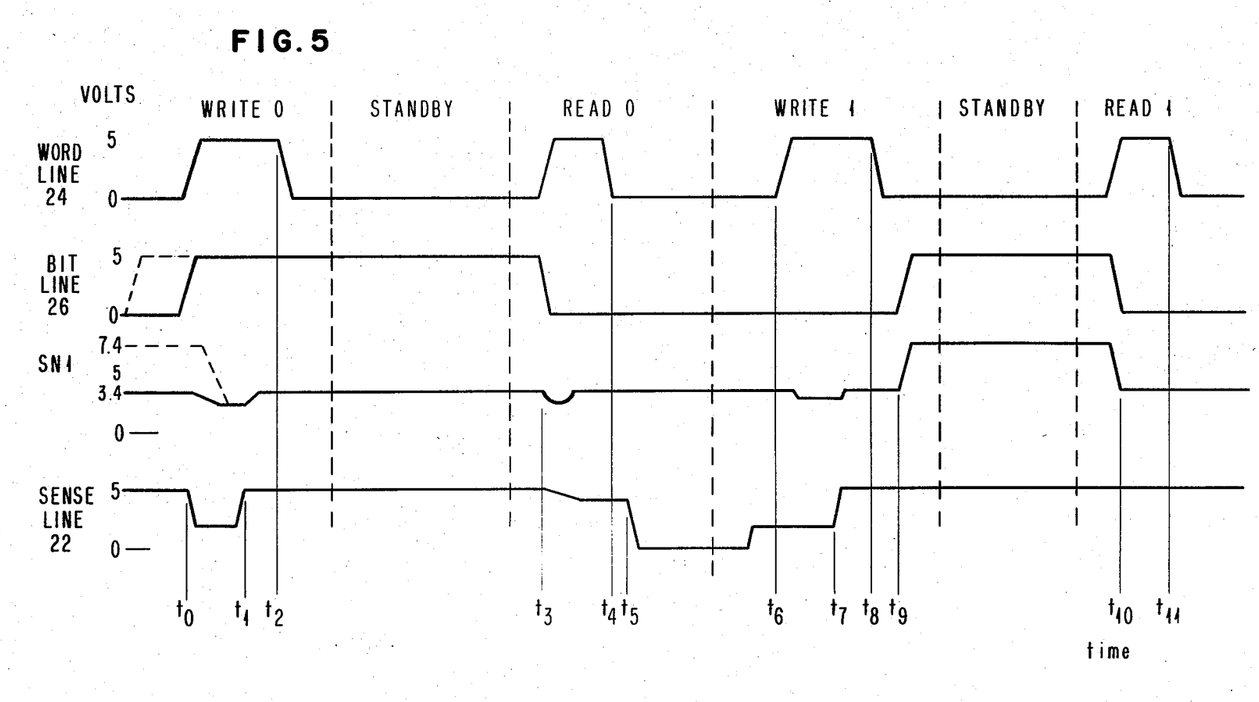
FIG. 5 is a pulse program which may be used to operate one cell the circuit illustrated in FIGS. 1-4.

To more clearly understand the operation of the circuit illustrated in FIGS. 1-4, reference may be had to FIG. 5 which shows a pulse program that may be used to operate the circuit of the present invention.

To write a 0 binary digit or bit of information into the cell 10, as indicated at time $t_0$, the voltage on the word line 24 is increased to +5 volts to turn on transistor 14 and the voltage on the sense line 22 is decreased from +5 volts to between zero and +3 volts, i.e., a decrease of at least one threshold voltage, $V_T$, e.g., 1.6 volts, causing the voltage on the first storage node SN1 to adjust to a value somewhat below +3.4 volts, regardless of whether a 0 or 1 digit had been previously stored in node SN1. At or prior to time $t_1$, the voltage on the first bit line 26 is increased to +5 volts to write the 0 digit. At time $t_1$, the voltage on the sense line 22 is returned to +5 volts driving the first storage node SN1 to +3.4 volts, which is equal to the voltage VDD minus a threshold voltage $V_T$. Charge is trapped on the first storage node SN1 by turning off transistor 14 at time $t_2$. During standby, the voltage on the word line 24 is maintained at zero volts, with the voltages on the first bit line 26 and the sense line 22 being maintained at +5 volts.

To read the 0 digit stored in node SN1, the voltage on the word line 24 is increased to +5 volts and the voltage on the first bit line 26 is lowered to zero volts, as indicated at time $t_3$, causing the voltage at node SN1 to decrease somewhat below +3.4 volts, turning on transistor 14 and, thus, discharging the sense line 22 by a voltage $\Delta V$ which is equal to the voltage change on the bit line 26, i.e., 5 volts, times the capacitance of the storage capacitor 12 divided by the capacitance of the sense line 22. The voltage on the word line 24 is turned off at time $t_4$. When the voltage on sense line 22 is applied to the sense amplifier circuit 32, which may be a conventional differential sense amplifier, the voltage drop $\Delta V$ on the sense line 22 is sufficient to set the amplifier circuit 32 so as to discharge the sense line 22 to ground or zero volts at time $t_5$.

To write a 1 binary digit or bit of information into the cell 10, as indicated at time $t_6$, the voltage on word line 24 is increased to +5 volts and the voltage on the sense line 22 is again adjusted to between zero and three volts causing the voltage on node SN1 to drop somewhat below 3.4 volts. At or before time $t_6$, the voltage on bit line 26 is set to zero volts to write the 1 digit. At time $t_7$, the voltage on the sense line 22 is increased to +5 volts, raising the voltage on the node SN1 to +3.4 volts. The word line 24 is set at zero volts at time $t_8$. When at time $t_9$ the voltage on the bit line 26 is again increased to +5 volts, the voltage on the storage node SN1 increases to approximately two times VDD volts minus a threshold voltage $V_T$, or to about 7.4 volts.

To read the 1 digit now stored in node SN1, the voltage on the word line 24 is increased to +5 volts and the voltage on the first bit line 26 is lowered to zero volts, as indicated at time $t_{10}$, causing the voltage at the node SN1 to decrease to +3.4 volts. Since the voltage at the storage node SN1 is not less than a threshold voltage below the voltage on the control gate of transistor 14, transistor 14 will not turn on and, therefore, the voltage on the sense line 22 remains at +5 volts. Thus, the sense amplifier 32 will not be set to discharge the sense line 22. The transistor 14 is turned off at time $t_{11}$.

It should be noted that while the cell 10 is being written into or read out, the voltage on the second bit line 28 is maintained at +5 volts. Accordingly, it can be seen that even though +5 volts is applied to the word line 24 to turn on transistor 14 of the cell 10, the cell 16 is not disturbed while reading cell 10 since the transistor 20 of the cell 16 is not turned on when accessing cell 10. The voltage stored on the second sense node SN2 of the cell 16 is at either +3.4 volts when storing a 0 digit or at approximately two times VDD minus a threshold voltage $V_T$, or about +7.4 volts, when storing a 1 digit. Thus, when +5 volts is applied to the control gate of transistor 20, the voltage at the second storage node SN2 is not lower than the threshold voltage, 1.6 volts, below the control gate voltage of the transistor 20.

While writing information into cell 10 the sense line is set at between zero and three volts, which could disturb cell 16. The preferred operation of the cells 10 and 16 is to read both cells before writing or restoring information into either cell, as will be explained in detail below by referring to FIGS. 6 and 7.

Figure 6:
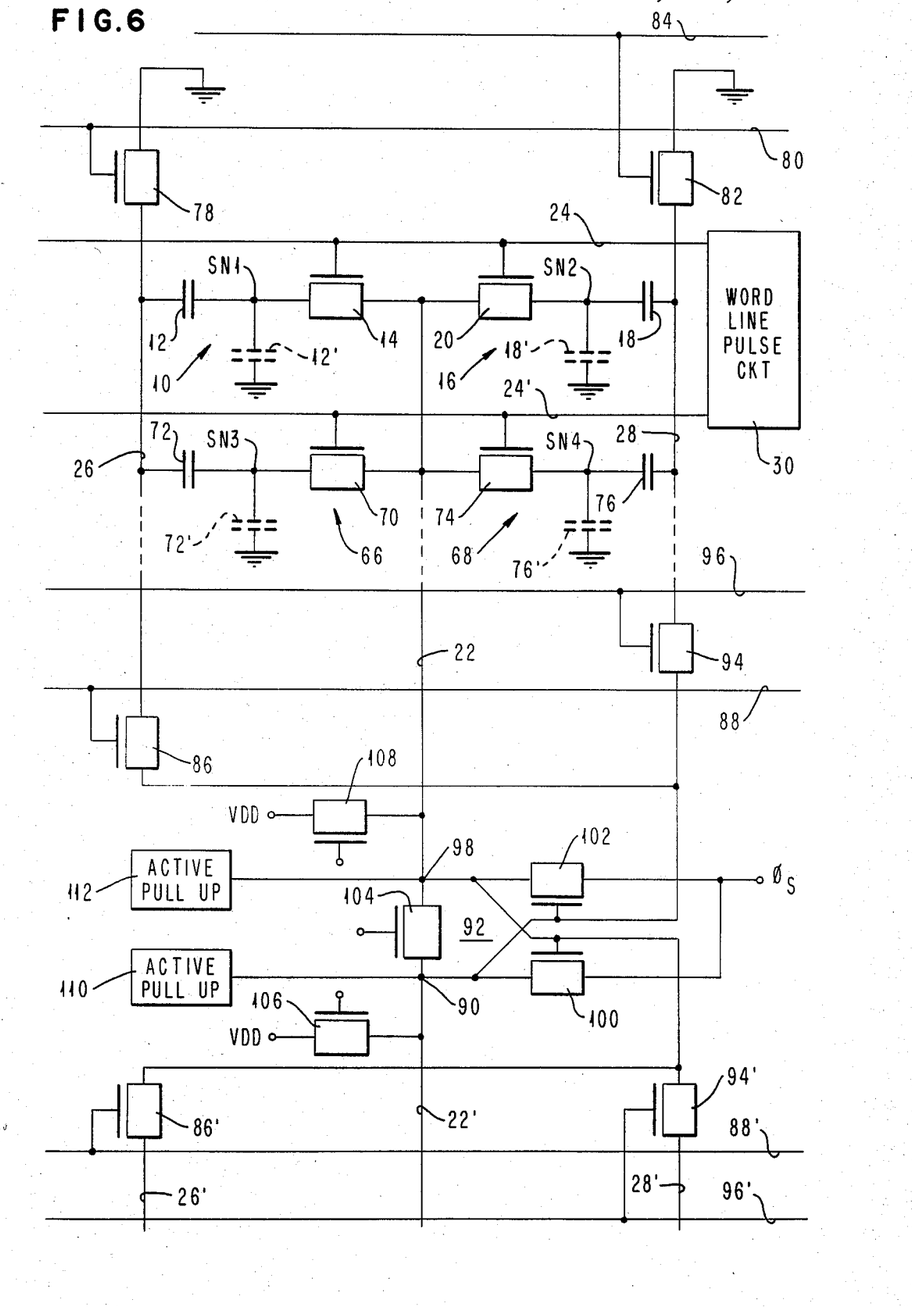
FIG. 6 is a circuit of the present invention illustrating a 2×2 array of memory cells.

In FIG. 6 a 2×2 array of cells of the present invention, similar to those illustrated in FIGS. 1–4 of the drawings, is shown along with circuitry for accessing each of the cells. The array includes first, second, third and fourth cells 10, 16, 66 and 68. The first cell 10 includes transistor 14, storage capacitor 12 and parasitic capacitor 12', with storage node SN1 being located at the common point between transistor 14 and capacitors 12 and 12'. The second cell 16 includes transistor 20, storage capacitor 18 and parasitic capacitor 18', with storage node SN2 being located at the common point between transistor 20 and capacitors 18 and 18'. The third cell 66 includes transistor 70, storage capacitor 72 and parasitic capacitor 72', with storage node SN3 being located at the common point between transistor 70 and capacitors 72 and 72'. The fourth cell 68 includes transistor 74, storage capacitor 76 and parasitic capacitor 76', with storage node SN4 being located at the common point between transistor 74 and capacitors 76 and 76'.

Each of the cells 10, 16, 66 and 68 is connected to sense line 22 with the first and third cells 10 and 66 also being connected to first bit line 26 and the second and fourth cells 16 and 68 also being connected to second bit line 28. First word line 24 is connected to the control electrodes of transistors 14 and 20 of the first and second cells 10 and 16, respectively, and second word line 24' is connected to the control electrodes of transistors 70 and 74 of the third and fourth cells 66 and 68, respectively. Word lines 24 and 24' are also connected to word line pulse circuit 30.

A first bit line select transistor 78, connected to a first bit line select line 80, connects the first bit line 26 to a reference or ground potential, and a second bit line select transistor 82, connected to a second bit line select line 84, connects the second bit line 28 to the reference or ground potential. A first write back transistor 86, connected to a first write back line 88, connects the first bit line 26 to a first sense node 90 of a differential sense amplifier or latch 92, and a second write back transistor 94, connected to a second write back line 96, connects the second bit line 28 to the first sense node 90 of latch 92. The sense line 22 is connected to a second sense node 98 of latch 92.

Sense amplifier or latch 92 also includes a pair of cross-coupled transistors 100 and 102 and a set latch terminal $\phi_S$. An equalizing transistor 104 is disposed between the latch sense nodes 90 and 98 and first and second precharge transistors 106 and 108 are connected between a supply voltage terminal VDD and sense nodes 90 and 98, respectively. First and second active pull up circuits 110 and 112, of any known type, are also connected to the latch sense nodes 90 and 98. As is known, if desired, the active pull up circuits may be connected directly to the first and second bit lines 26 and 28.

Bit lines 26' and 28', sense line 22' and write back transistors 86', 94' and lines 88', 96' connect to another array of cells, not shown, similar to the cells 10, 16, 66 and 68 in a mirror image arrangement with respect to latch 92.

Figure 7:
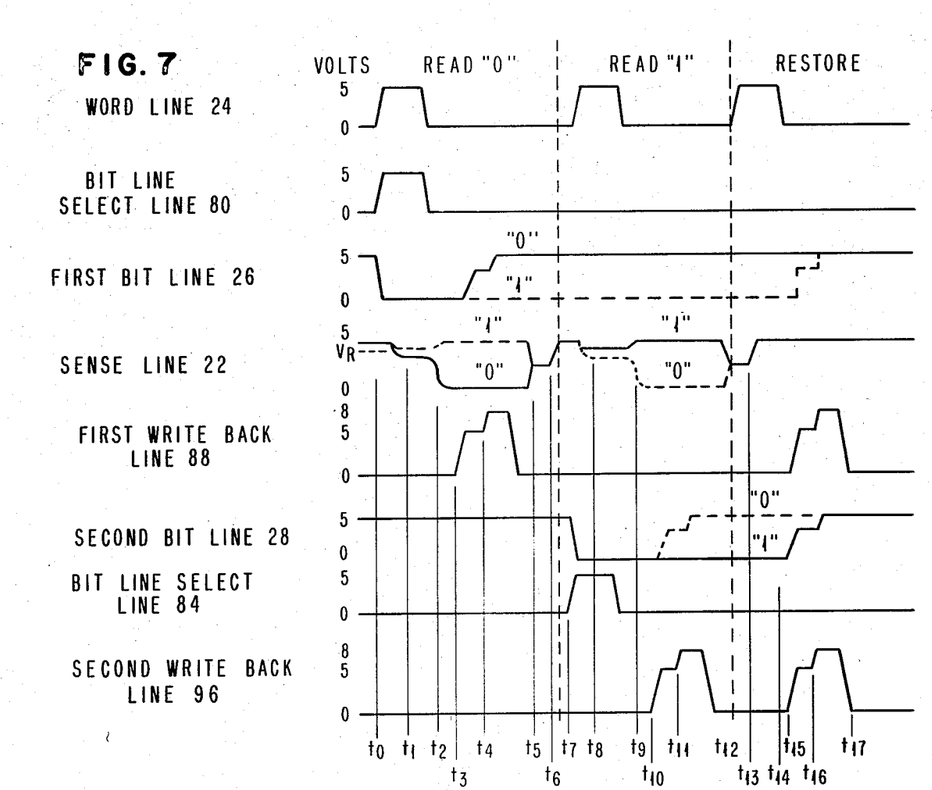
FIG. 7 is a pulse program which may be used to operate the circuit of the invention shown in FIG. 6.

To better understand the operation of the memory illustrated in FIG. 6 of the drawings, reference may be had to the pulse program indicated in FIG. 7. To read the information stored in cell 10 of the array, as indicated at time $t_0$, the voltage on the sense line 2 is precharged to +5 volts and permitted to float and the voltage on the word line 24 and on the first bit line select line 80 is increased to +5 volts, turning on transistor 14 and grounding the first bit line 26. A reference voltage $V_R$, having a magnitude midway between the magnitude of the voltage representing a 1 digit and the voltage representing a 0 digit on the sense line 22, is temporarily applied to the latch sense node 90. The voltage $V_R$ may be conveniently produced in a dummy cell, not shown, connected to sense line 22' in any known manner, as well as to sense line 22. As seen in FIG. 7 by a solid line, the voltage on the sense line 22 drops significantly at time $t_1$ below the level of the reference voltage $V_R$, indicating the presence of a 0 digit in cell 10. After time $t_1$, the voltage on the word line 24 drops to zero volts. At time $t_2$, the latch 92 is set by decreasing the voltage at terminal $\phi_S$ causing the voltage on the sense line 22 to discharge to zero volts through transistor 102. Thus, the voltage on the sense node 98 of the latch 92 is at approximately zero volts and the voltage on the latch sense node 90 is at approximately +5 volts by timely turning on the active pull up circuit 110. It can be seen in FIG. 7 by the dashed line that, if a 1 digit had been stored in the storage node SN1, the voltage on the sense line 22 would have dropped only very slightly at time $t_1$ to a value which is higher than the reference $V_R$. Thus, when the latch 92 was set at time $t_2$, the voltage on the sense line 22 would have been established at +5 volts along with latch sense node 98, while sense node 90 would have gone to ground or zero volts.

At time $t_3$, a data or signal restoring action begins for the cell 10. The voltage on the first write back line 88 is increased to +5 volts to turn on the first write back transistor 86, with the bit line select transistor 78 off, and at time $t_4$ the voltage on the first write back line 88 is increased to +8 volts, preferably by using known bootstrapping techniques, to apply the +5 volts from the latch sense node 90 to the first bit line 26. The +5 volts are trapped on the bit line 26 by turning off the first write back transistor 86.

After the +5 volts is applied to the first bit line 26, the equalizing transistor 104 is turned on to equalize the voltage on the sense lines 22 and 22' to a magnitude of approximately +2.5 volts, as indicated at time $t_5$.

At time $t_6$, the precharge transistors 106 and 108 are turned on to assure a full +5 volts on the sense line 22 prior to reading out the information stored in the second cell 16. Sense line 22 is permitted to float at +5 volts and the voltage on the second bit line select line 84 is increased at time $t_7$ to +5 volts grounding the second bit line 28 and the voltage on the word line 24 is increased to +5 volts to turn on the transistor 20. The reference voltage $V_R$ is again temporarily applied to the sense latch node 90. As seen at time $t_8$ by the solid line, the voltage on the sense line 22 drops only slightly, remaining above the reference voltage $V_R$ applied to latch sense node 90, indicating the presence of a 1 digit in the second cell 16. At time $t_9$, the latch 92 is set by decreasing the voltage at terminal $\phi_S$ causing the voltage on the sense line 22 to remain at a high value, approximately +5 volts. Thus, the voltage on the sense node 98 of the latch 92 is at approximately +5 volts and the voltage on the latch sense node 90 is at approximately zero volts or ground. It can be seen in FIG. 7 by the dashed line that, if a 0 digit had been stored in the storage node SN2, the voltage on the sense line 22 would have dropped below the reference voltage $V_R$. Accordingly, when the latch 92 was set at time $t_9$, the voltage on the sense line 22 would have been established at zero volts along with latch sense node 98, while sense node 90 would have been at approximately +5 volts.

Data or signal restoring action begins at time $t_{10}$ for the second cell 16. The voltage on the second write back line 96 is increased to +5 volts to turn on the second write back transistor 94, with the bit line select transistor 82 off, and at time $t_{11}$ the voltage on the second write back line 96 is increased to +8 volts, preferably by using known bootstrapping techniques, to apply ground or zero volts from the latch sense node 90 to the second bit line 28. The voltage on the second write back line 96 may be reduced to zero volts shortly after time $t_{11}$ and the equalizing transistor 104 turned on to apply approximately +2.5 volts on sense lines 22 and 22'.

The data restoring action for the cells 10 and 16 is completed between times $t_{12}$ and $t_{17}$. At time $t_{12}$, the voltage is increased on the word line 24 to +5 volts with the voltage on the first bit line 26 at +5 volts and the voltage on the second bit line 28 at zero volts. The precharge transistors 106 and 108 are turned on at time $t_{13}$ to raise the sense line 22 to +5 volts. It can be seen that with +2.5 volts on the sense line 22 and +5 volts on the control gate of transistor 14 of the first cell 10 and on the first bit line 26, the voltage on the sense node SN1 will be established at a value somewhat below 3.4 volts and, when the sense line voltage is increased to +5 volts at time $t_{13}$, the voltage at the sense node SN1 increases to +3.4 volts, or one threshold voltage below the voltage applied to the gate electrode of transistor 14, completely restoring the 0 digit into the cell 10. It can also be seen that with +2.5 volts on the sense line 22, +5 volts on the control gate of transistor 20 of the second cell 16 and zero volts on the second bit line 28 at time $t_{12}$, the voltage on the sense node SN2 will be established at a value somewhat below 3.4 volts and when the sense line voltage is increased to +5 volts at time $t_{13}$, the voltage at the sense node SN2 increases to +3.4 volts. The voltage on the word line 24 is decreased to zero volts at time $t_{14}$. At time $t_{15}$ the voltage on the second write back line 96 is increased to +5 volts to turn on the second write back transistor 94 and at time $t_{16}$ the voltage on the second write back line 96 is increased to about +8 volts to apply +5 volts from the latch sense node 90 to the second bit line 28. With +5 volts now applied to the second bit line 28, the voltage on storage node SN2 of the second cell 16 increases from +3.4 volts to approximately 7.4 volts to restore the 1 digit of information into the second cell 16. The voltage on the second write back line 96 is reduced to zero volts at time $t_{17}$ leaving both the first and second bit lines at +5 volts with the storage node SN1 of the first cell 10 at 3.4 volts storing a 0 digit and the storage node SN2 of the second cell 16 at 7.4 volts storing a 1 digit.

It should be understood that the third and fourth cells 66 and 68 are accessed in the same manner as the first and second cells except that the second word line 24' is selected and the first word line 24 is maintained at zero ground potential.

As indicated hereinabove, when reading information from one cell of the array, the other cells of the array are not disturbed. However, it should be noted that during a write operation in one cell, e.g., the cell 10, another cell, e.g., the third cell 66, could be disturbed. It can be seen that when writing a 1 digit into the first cell 10, the voltage on the unselected word line 24' is at zero volts and the first voltage on the bit line 26 voltage is reduced to zero volts. Since the storage node SN3 of the third cell 66 may be at 3.4 volts storing a 0 digit, the voltage at the storage node SN3 decreases to −1.6 volts when the voltage on the first bit line 26 is reduced from +5 volts to zero volts. Although the voltage on the sense node SN3 is not lower than the normal voltage threshold $V_T$, i.e., 1.6 volts, below the voltage on the control gate of transistor 70, since the voltage at the control gate of transistor 70 has been reduced to zero volts, it is known that the threshold voltage of the transistor 70 decreases below the normal threshold voltage $V_T$ of 1.6 volts. Accordingly, charge from storage node SN3 would leak through the transistor 70 unless precautions were taken. It should be noted that in the embodiment of the invention disclosed in FIG. 6 leakage from storage node SN3 is avoided by providing the parasitic capacitor 72' in the third cell 66. Since the storage capacitor 72 and the parasitic capacitor 72' are arranged in series between the first bit line 26 and ground, when the voltage on the first bit sense line 26 is reduced from +5 to zero volts, only a portion of this voltage drop is experienced at the storage node SN3. Thus, the circuit may be designed so that the voltage at the storage node SN3 is always at a sufficiently high voltage to prevent leakage through the transistor 70. As can be seen in FIGS. 2, 3 and 4 of the drawings, by providing P+ regions, such as regions 47 and 59, under the N+ diffusion regions 36 and 50 parasitic capacitors having a relatively high value of capacitance can be produced.

It should be noted that a novel memory has been disclosed wherein a sense line and a word line can be shared by two or more memory cells to provide improved cell density of one device cells. By arranging cells on both sides of a sense line, the number of cells is doubled with the same number of crossing word lines. Thus, a shorter sense line is required per given number of cells to provide an improved signal transfer ratio between the storage capacitors and the sense line and a sense amplifier pitch is provided which is at least double the pitch available in known one device cell arrays, which is particularly important when fabricating a memory cell having a small semiconductor substrate surface area. For example, if four independently operated bit lines were used instead of only the two bit lines 26 and 28, the sense amplifier pitch could be four times the pitch of known one device cell arrays.

It should also be noted that the memory array in accordance with teachings of this invention develops a lower voltage across the storage capacitor than that found in a conventional one device memory array, since the voltage across the storage capacitor is never more than about 2.4 volts in the standby condition. In conventional one device memory arrays the capacitor reference plate is at 5 volts but the 0 digit is stored at zero volts producing a voltage difference of 5 volts across the storage capacitor. Due to this reduced voltage across the storage capacitor, it is possible to use thinner dielectric layers in the capacitor and, therefore, provide more storage capacitance in a given area. Furthermore, the present invention inherently provides a full 5 volt discharge of the storage capacitor during the read operation, i.e., when the bit line is changed from +5 volts to ground. In conventional one device memories, the capacitor discharge is limited to the word line voltage change less one threshold voltage, i.e., about 3.4 volts. Conventional one device memories require boosted word line circuitry to achieve a 5 volt discharge of the storage capacitor. Also, the array of the present invention may be used in known folded sense line and multiplexed sense amplifier arrangements.

It should be understood that although a 2×2 array of cells has been illustrated in the interest of clarity, the memory array of this invention may have hundreds of thousands of cells with one hundred or more word lines and one hundred or more sense lines.

While the invention has been particularly shown and described with reference to preferred embodiments thereof, it will be understood by those skilled in the art that various changes in form and details may be made therein without departing from the spirit and scope of the invention.

What is claimed is:

1. In a read/write memory array including at least first and second data storage cells for independently storing data signals, each data storage cell having a control electrode-responsive switching device for serially connecting a storage capacitance between a data sense node and a reference node, the improvement characterized in that the respective control electrodes of the first and second data storage cells are electrically connected to a first common line and the respective data sense nodes of the first and second data storage cells are electrically connected to a second common line.

2. A memory comprising
first and second data storage cells each having a data sense node and a reference node,
a common sense line connected to each of said data sense nodes, and
first and second means for producing data signals, said first means being connected to the reference node of said first data storage cell and said second means being connected to the reference node of said second data storage cell.

3. A memory as set forth in claim 2 wherein each of said cells includes switching means having a control electrode and a storage capacitor connected to said switching means.

4. A memory as set forth in claim 3 further including means for simultaneously operating said switching means.

5. A memory as set forth in claim 3 wherein said switching means in each of said cells is disposed between said sense line and said capacitor of the respective cell.

6. A memory as set forth in claim 5 wherein each of said cells further includes a second capacitor connected serially with said storage capacitor between said reference node of the respective cell and a point of reference potential.

7. A memory as set forth in claim 4 wherein said operating means includes a word line connected to the control electrode of each of said switching means.

8. A memory as set forth in claim 7 wherein each of said switching means includes a field effect transistor.

9. A memory as set forth in claim 2 further including a sense amplifier arranged to produce a first data voltage on a first node and a second data voltage on a second node, said first node being coupled to said sense line and said second node being coupled to each of said reference nodes.

10. A memory as set forth in claim 9 further including first and second write back switching means, said first write back switching means being interposed between said second node and said reference node of said first cell and said second write back switching means being interposed between said second node and said reference node of said second cell.

11. A memory as set forth in claim 10 further including means for selectively grounding each of said reference nodes.

12. A memory system comprising
a common sense line,
first and second bit lines,
a first storage cell connected between said sense line and said first bit line,
a second storage cell connected between said sense line and said second bit line,
first switching means,
a sense amplifier having a first node connected to said sense line and a second node connected to said first and second bit lines through said switching means, and
means for applying data signals to said first and second bit lines.

13. A memory system as set forth in claim 12 wherein each of said first and second cells includes a storage capacitor and second switching means and further including means for simultaneously operating said second switching means.

14. A memory system as set forth in claim 13 wherein each of said second switching means includes a field effect transistor interposed between said sense line and said storage capacitor of the respective cell.

15. A memory system as set forth in claim 14 wherein said operating means includes a word line connected to the control gate of each of said transistors.

16. A memory system as set forth in claim 15 wherein said first cell further includes a second capacitor serially connected with said storage capacitor of said first cell between said first bit line and a point of reference potential and said second cell further includes a second capacitor serially connected with said storage capacitor of said second cell between said second bit line and said point of reference potential.

17. A memory system comprising
a sense line,
first and second bit lines,
a first storage cell storing a first signal voltage therein connected between said sense line and said first bit line,
a second storage cell storing a second signal voltage therein connected between said sense line and said second bit line,
means coupled to said sense line for producing a first true signal of said first signal voltage and a first complementary signal representative of said first signal voltage,
means for applying said first complementary signal to said first bit line,
means for producing a second true signal of said second signal voltage and a second complementary signal representative of said second signal voltage,
means for applying said second complementary signal to said second bit line, and
means coupled to said sense line and to said first and second bit lines for restoring said first and second signal voltages to said first and second storage cells, respectively.

18. A memory system as set forth in claim 17 wherein each of said storage cells includes a field effect transistor serially connected with a storage capacitor forming a storage node at the common point therebetween at which said signal voltages are stored.

19. A memory system as set forth in claim 18 wherein in each of said cells said storage capacitor is connected to said sense line through said transistor and each of said cells further includes a second capacitor connected between said storage node and a point of reference potential.

20. A memory comprising
a sense line,
first and second bit lines,
first switching means having a control electrode interposed between said sense line and said first bit line,
a first storage capacitor having a first conductive plate connected to said first bit line and a second conductive plate connected to said sense line through said first switching means,
second switching means having a control electrode interposed between said sense line and said second bit line,
a second storage capacitor having a first conductive plate connected to said second bit line and a second conductive plate connected to said sense line through said second switching means,
a word line connected to said control electrodes,
means for selectively applying a voltage pulse to said word line,
means for selectively applying a voltage to said sense line, and
means for selectively applying data signals to said first and second bit lines.

21. A memory system as set forth in claim 20 wherein said first and second switching means each includes a field effect transistor.

22. A memory system as set forth in claim 21 further including means coupled to said sense line for detecting voltage changes in said sense line.

23. A memory system as set forth in claim 22 wherein said voltage change detecting means includes a differential sense amplifier having first and second sense nodes.

24. A memory system as set forth in claim 23 further including third and fourth switching means and wherein said sense line is connected to said first sense node and said first and second bit lines are connected through said third and fourth switching means, respectively, to said second sense node.

25. A memory system as set forth in claim 24 wherein said means for selectively applying data signals includes means for selectively connecting said first and second bit lines to a reference potential.

26. A memory system as set forth in claim 20 further including a third storage capacitor connected between said second conductive plate of said first storage capacitor and a point of reference potential, and a fourth storage capacitor connected between said second conductive plate of said second storage capacitor and said point of reference potential.

* * * * *